(12) United States Patent
Gougol

(10) Patent No.: US 11,677,146 B2
(45) Date of Patent: Jun. 13, 2023

(54) PROGRAMMABLE ANALOG BEAMFORMER

(71) Applicant: Navid Gougol, Los Gatos, CA (US)

(72) Inventor: Navid Gougol, Los Gatos, CA (US)

(*) Notice: Subject to any disclaimer, the term of this patent is extended or adjusted under 35 U.S.C. 154(b) by 25 days.

(21) Appl. No.: 16/230,735

(22) Filed: Dec. 21, 2018

(65) Prior Publication Data

US 2021/0336336 A1   Oct. 28, 2021

(51) Int. Cl.
*H01Q 3/34* (2006.01)
*H03F 3/22* (2006.01)

(52) U.S. Cl.
CPC .............. *H01Q 3/34* (2013.01); *H03F 3/22* (2013.01); *H03F 2200/451* (2013.01)

(58) Field of Classification Search
CPC .......... H01Q 3/34; H01Q 3/26; H03F 1/3282; H03F 2201/3212
USPC ....................................................... 342/372
See application file for complete search history.

(56) References Cited

U.S. PATENT DOCUMENTS

| | | | |
|---|---|---|---|
| 2015/0171935 A1* | 6/2015 | Khandelwal | H03K 5/1536 455/41.1 |
| 2016/0011305 A1* | 1/2016 | Koptenko | G01S 7/52047 367/7 |
| 2016/0097846 A1* | 4/2016 | Mortensen | G01S 7/52034 367/97 |
| 2017/0264014 A1* | 9/2017 | Le-Ngoc | H01Q 21/06 |
| 2018/0302175 A1* | 10/2018 | Yuan | H04B 7/0617 |
| 2018/0331746 A1* | 11/2018 | Okuyama | H04B 7/063 |
| 2020/0252143 A1* | 8/2020 | Liu | H04W 24/00 |

\* cited by examiner

*Primary Examiner* — Harry K Liu
(74) *Attorney, Agent, or Firm* — Walt Froloff

(57) ABSTRACT

A programmable analog beamformer controls phase and amplitude of radio frequency sine signals independently on n channels. In a preferred embodiment, each of n channels achieves full cycle phase sifting by using m first order programmable filters isolated by buffer amplifiers, with maximum phase shift amount of 180/m degrees in each filter. By flipping the polarity of sine signal in differential path, the beamformer achieves additional 180 degrees phase shift. There is an amplitude control unit in each channel, that both compensates amplitude attenuations due to phase shifting of filters, and to control the amplitude of the RF signal per user choice. There is a core algorithm software that handles all the digital programming of the system, as well as error correction of the phase and amplitude. The analog beamformer can drive piezoelectric ultrasonic transducers with no unwanted harmonics, or other loads per application.

11 Claims, 6 Drawing Sheets

PROGRAMMABLE ANALOG BEAMFORMER

REFERENCES CITED

U.S. Patent, Gougol 62/609,880

OTHER PUBLICATIONS

N. Gougol et al, "Design and Implementation of Multi-channel High Power Programmable Phase Array for Ultrasonic Application", UC Berkeley Electrical Engineering and Computer Sciences Department, Technical Report Memorandum Series, Technical Report No. UCB/EECS-2016-221

FIELD OF THE INVENTION

This invention relates to beamformers, and more particularly, beamformer driving systems where only single tone sine signals are needed to be present at loads to avoid unwanted higher harmonics, which controls phase and amplitude of RF signals on each channel; it is particularly invented to drive ultrasonic piezoelectric transducer loads, and can be used for electromagnetic applications.

BACKGROUND OF THE INVENTION

In a phased array beamformer system, such as ultrasound phased array systems, or electromagnetic (EM) phased array systems, phase and amplitudes of radio frequency (RF) sine signals need to be controlled in n parallel channels, so that the acoustic or EM waves generated by the loads can add constructively in a desired point. The focus of energy can be steered by applying appropriate phase and amplitudes in each of n channels.

For example, ultrasound phased-array systems are used in radiation oncology to focus the acoustic energy on tumor cells and ablate them thermally, called High Intensity Focused Ultrasound (HIFU). For many applications such as HIFU, there is no need for reception of reflected transmitted signals, as the focal point is observed in other methods such as Magnetic Resonance Imaging.

Phased-array systems published in prior arts or commercially available in markets are sending tristate digital pulses to outputs. This has the issue of unwanted harmonics. There is no prior arts that described this hardware-software co-designed analog beamformer.

SUMMARY OF THE INVENTION

In accordance with the present invention, the programmable analog beamformer branches single RF sine signal at the frequency of user choice to n parallel channels. Each of n channels does independent phase shifting and amplitude control of the sine signal to send same sine signal to its output based on user programmed phase and amplitude on each channel.

Phase shifting in each of n channels are done by m first order filters isolated by buffer amplifiers, where each filter delays the RF signal from 0 degrees to 180/m degrees. Phase shifting in each channel is achieved by programming a digital potentiometer resistor which with a fixed capacitor forms a single pole filter. Alternatively, the resistor can be chosen fixed and capacitor be programmed, or both resistor and capacitor be programmed, but these are not implemented in this invention. Changing the resistor will change the single pole of the filter and consequently creates phase delay.

Maximum phase shifting of all m filters in each of n channels are 180 degrees, and another 180 degree phase shift in RF signal is achieved by sending the RF signal to a differential path of an inverting and non-inverting amplifier stage and tapping the RF signal from opposite polarity stage if 180 degree shift is needed or same polarity stage if no phase shift is needed.

Phase shifting in each of m filters creates signal attenuation, and this attenuation is compensated by an amplitude control unit. The amplitude control is achieved by any of the following two ways, or both of them together. One way of amplitude control is the use of a digital potentiometer resistor as a voltage divider configuration with a fixed resistor. Another way is to use a digital potentiometer resistor in a feedback network of a current feedback amplifier, to control the gain with minimal phase shift due to minimal bandwidth change of the amplifier. The voltage divider is again isolated from filters by buffer amplifiers. There is also minimal phase shift in voltage divider due to low pass filter nature of the circuit. There is a error correction mechanism included in current invention.

There many sources of phase and amplitude errors in this invention. Errors can be generated by amplitude control units, electronic component mismatches, layout parasitics, and so on. These errors are captured at each channel output by observing the signal phase and amplitude, for example by using standard I/O communications of an oscilloscope, probing the outputs. The read phases and amplitudes are fed back core algorithm software that runs on the beamformer to create an error correction table. This table is used for error correction.

After phase shifters and amplitude control units in each channel, RF signal goes to a power stage amplifier to deliver high voltage swing signal to the channel load. Standard loads in ultrasonic beamformers are 50 ohm impedance piezoelectric transducers at resonance frequencies. The power is delivered differentially to its load, or single ended, with differential having four times more RF power. In HIFU applications, the power to each load can be few watts to tens of watts, and in Low Intensity Focused Ultrasonic application, the power can be lower.

Analog nature of the invention requires different noise suppression techniques to get high signal-to-noise ratio (SNR) sine signals at outputs of printed circuit boards. High SNR is achieved by different electromagnetic interference (EMI) rejection techniques; such as using quality circuit layouts, bypass capacitors, and noise filtering methods.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
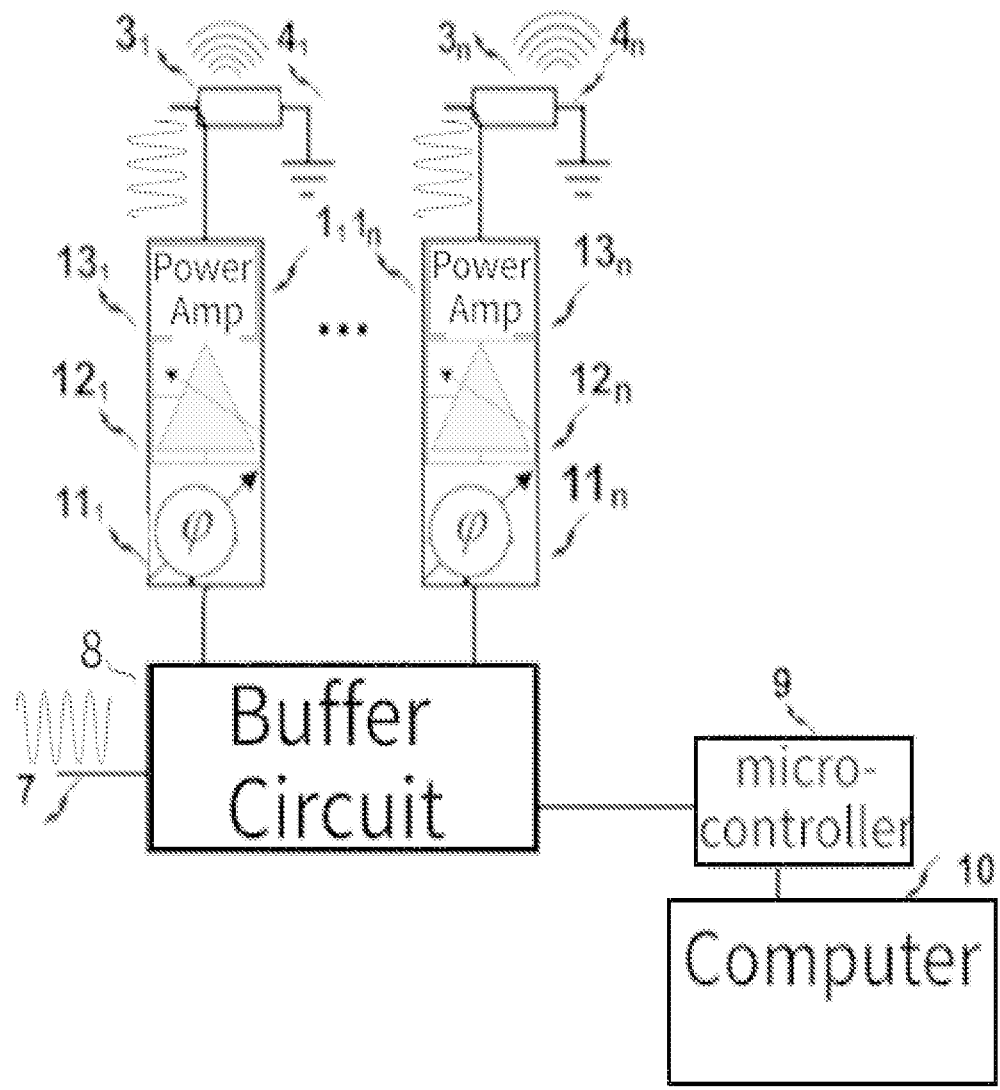
FIG. 1 is the architecture of n channel programmable analog beamformer in accordance with the present invention.

Simplified block diagram of programmable analog beamformer is shown in FIG. 1. Input Radio Frequency (RF) sine signal 7 at frequency of user choice enters the system (which can come from a function generator or a builtin signal generator embedded in the beamformer). The sine signal branches out to n channels $1_1, 1_2 \ldots 1_n$ in buffer circuit 8 (details not shown). Branching can be done via a buffer amplifier, or directing wiring to n channels as inputs of channels are high impedance and there will be no loading effect.

Each channel $1_1, 1_2 \ldots 1_n$ has three parts: phase shifters $11_1, 11_2 \ldots 11_n$; Amplitude control units $12_1, 12_2 \ldots 12_n$; and final power amplifiers $13_1, 13_2 \ldots 13_n$. These three parts generate same RF sine signal of buffer 8 with different phase and amplitude at outputs to loads $3_1, 3_2 \ldots 3_n$. Phases and amplitudes in each channel is set through user interface software by users.

Figure 5:
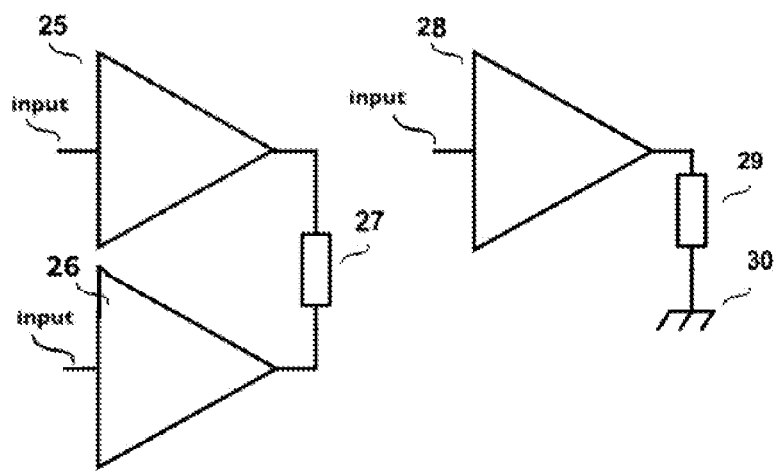
FIG. 5 is power stage to the loads in each of n channels in accordance with the present invention.

Loads $3_1, 3_2 \ldots 3_n$ can be piezoelectric transducers in ultrasound applications with standard impedance of 50 ohm at resonance frequencies. The electrical power to the loads can be applied single ended or differentially, as shown in FIG. 5. The loads are half of the actual impedance in differential power delivery, and complete impedance in case of single ended power delivery.

The grounds $4_1, 4_2 \ldots 4_n$ are virtual grounds, in case of differential power delivery (zero voltage of beamformer circuit), and real grounds of beamformer circuit, in case of single ended power delivery. Micro-controller 9 receives its digital instructions from a core software algorithm written in C++ that runs on computer 10, and programs each channel for different phase and amplitude; it also handles error correction mechanism.

Figure 2:
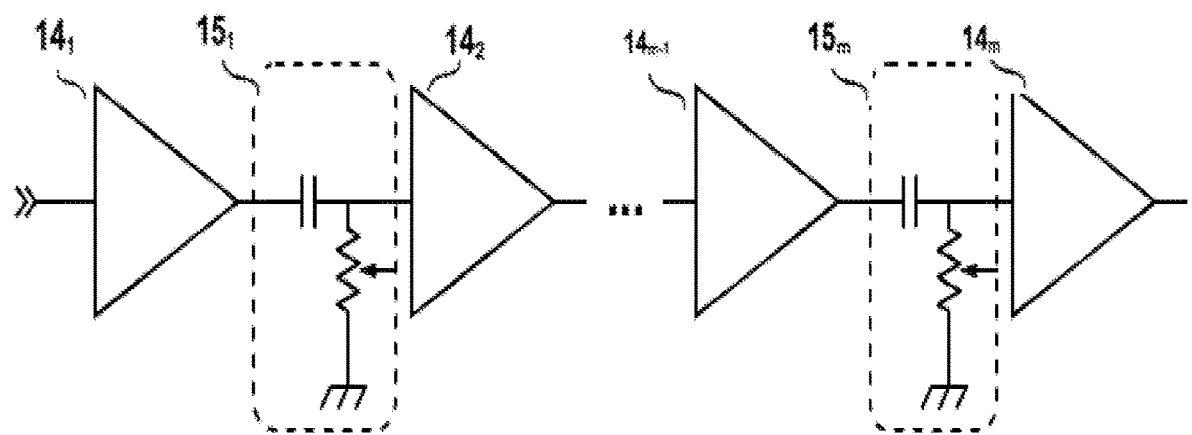
FIG. 2 is m phase shifters in each of n channels in accordance with the present invention.
Figure 3:
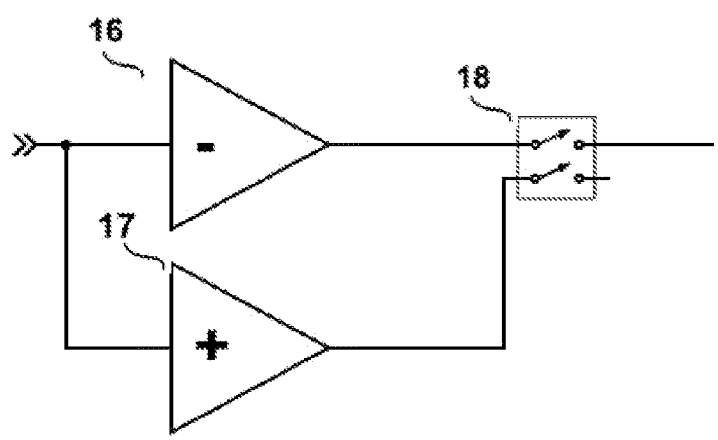
FIG. 3 is a signal sign inverter in each of n channels in accordance with the present invention.

FIG. 2 and FIG. 3 together show one of the phase shifters $11_1, 11_2 \ldots 11_n$ in each channel $1_1, 1_2 \ldots 1_n$. As seen in FIG. 2, there are m first order filters $15_1, 15_2 \ldots 15_m$. Each filter $15_1, 15_2 \ldots 15_m$ is isolated by buffer amplifiers at input and output. For example, filter $15_1$ has buffer amplifier $14_1$ and $14_2$, and filter $15_m$ has $14_{m+1}$ and $14_m$. The purpose of buffer amplifiers $14_1, 14_2 \ldots 14_m$ are to keep the filters first order, as known in the art.

Figure 6:
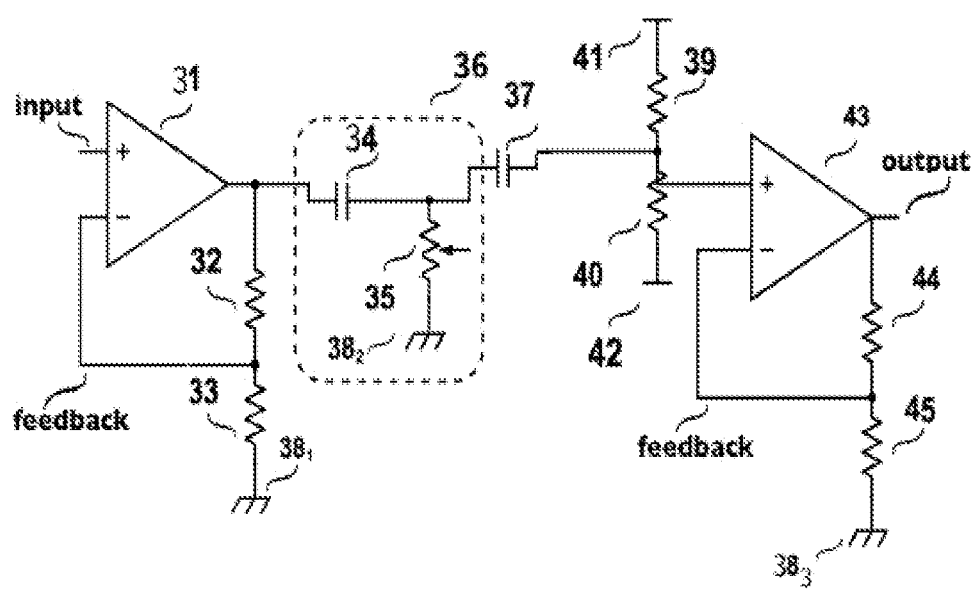
FIG. 6 is a first order filters in one of m phase shifters, with isolating buffer amplifiers in each of n channels in accordance with the present invention.

FIG. 6 shows one of m filters $15_1, 15_2 \ldots 15_m$ in dotted line 36. Buffer amplifier 31 at input and buffer amplifier 43 at output, as mentioned above, act as isolators to keep the single pole of the filter 36. The reason 36 is a single pole filter is that filter capacitor 34 on its left hand side has output of amplifier 31 with a shunt feedback which results in a very low impedance in compare to resistor 35 (technically a ground). On the right hand side of capacitor 34, there is a decoupling capacitor 37 which is a large value for the frequency of operation and short circuit in AC analysis, as known in the art. Bias resistors 39 and 40 of amplifier buffer 43 are very large values in compare to filter resistor 35, which are all three in parallel with each other in AC analysis, so resistor 39 and 40 can be ignored. Also input impedance of buffer amplifier 43 is very large value which is again in parallel with resistor 35. These will result in capacitor 34 sees a ground on its left hand side and only resistor 35 on its right hand side, and filter time constant is R*C where R is resistor 35 and C is capacitor 34. The filter 36 pole is located at frequency $1/(2*\pi*R*C)$.

In this invention, R above is a programmable digital potentiometer resistor, which by changing R, the location of the pole is changed and hence the phase shifting amount can be controlled, as known in the art. Alternatively, C can be changed, for example using a varactor, or both R and C be changed. It is also possible to swap the position of R and C in filter 36, which results in a same single pole filter (which is a low pass filter in this case, and 36 is a high pass filter), and same concept can be applied, as know in the art.

Phase shifting amount, $\Delta\varnothing$, in each filter $15_1, 15_2 \ldots 15_m$ will be based on the following equation when the resistor is programmed from $R_1$ to $R_2$:

$$\Delta\varnothing = \arctan(2*f*C*R_2) - \arctan(2*\pi*f*C*R_1), \quad (1)$$

where f is the frequency of operation in Hertz and C is the fixed capacitor in each filter in Farad. As seen in equation (1) above, by increasing R the filter create positive phase shift, and by decreasing R the filter creates negative phase shift (sine signal moves toward left). Also this phase shifting is non-linear, which can be medicated by use of enough number of filters and fine enough value changes in R (the phase shift amount can be less than phase resolution requirements).

Each filter $15_1$ to $15_m$ can create phase shifting of 0 degrees to 180/m degrees, where all m filters in each channel create phase shifting of 0 to 180 degrees. Value m in the current invention is 4-7 which has good experimental results for 0.1-3 MHz range circuit operation with fine phase steps of less then 5 degrees. C is chosen to be 1 nF, and R is a digital potentiometer from 40 ohm to 10 k, with 256 values to choose. For 1-2 MHz operation which is mostly the case in HIFU, m of 4, digital potentiometer of 40 ohm to 1 k with 64 values to choose have achieved the goals. Different variations for different specifications can be chosen. For higher frequency, like 10 MHz, the fixed filter capacitor C can be switched to a smaller value, like 0.2 nF, using a RF switch similar to FIG. 3 in sign inverter.

Additional 180 degree phase shifting in each channel is shown in FIG. 3, where the RF sine signal in the channel goes through inverting amplifier 16 and non-inverting amplifier 17 (circuitry details not shown). By using a RF switch 18 with large enough 3 dB bandwidth in compare to the frequency of operation, inverting amplifier 16 output is selected for 180 degree phase shift or non-inverting amplifier 17 output is selected for no phase shifting. This selection can also be opposite by defining the zero phase origin of the signal. This sign inverter can be placed anywhere in the channel signal path, but in this invention it is placed before final power amplifiers to provide negative polarity signal for differential power delivery; in this case another RF switch with same select signal is used in parallel with switch 18 with the switch inputs swapped (details not shown).

Phase shifting in each filter introduces amplitude loss which needs to be compensated in order to keep the amplitude flat for the RF signal. Amplitude loss in each filter is calculated in the core software algorithm, by following equation:

$$\check{A} = (R*C*2*\pi*f)/\sqrt{(1+(R*C*2*\pi*f)^2)}, \quad (2)$$

where, C is the capacitor in filter, f is the frequency of operation, and R is the resistor in the filter. The value $\check{A}$ is the attenuation amount which is a real number between 0 and 1, with 1 means no attenuation and 0 means complete signal attenuation (complete signal loss). Equation (2) above come from high pass filter nature of the filters where they have a zero at DC, and a single pole at 1/RC. If low pass filter circuit is used instead in filters $15_1$ to $15_m$ the numerator of equation (1) will be constant 1, as known in the art.

Figure 4:
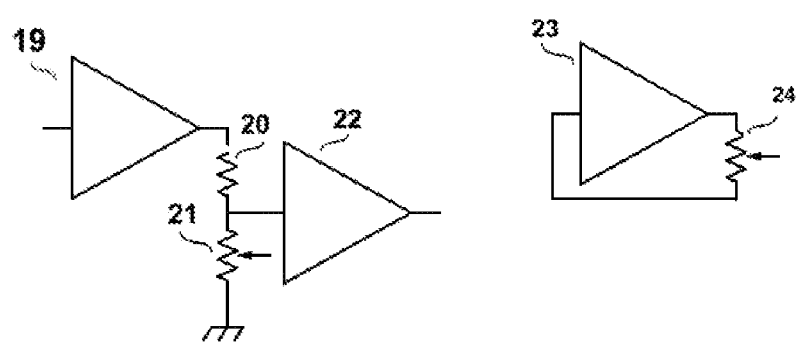
FIG. 4 is amplitude control unit in each of n channels in accordance with the present invention.

Amplitude losses in all m filters of each channel are calculated by core software algorithm, based on equation (2), and are compensated accordingly by amplitude control unit in FIG. 4. Amplifier buffers 19 and 22 at input and output of the voltage divider resistors 20 and 21 isolate the divider similar to filters explained above in this disclosure. Resistor 20 is a fixed resistor and resistor 21 is a digital potentiometer programmed by core algorithm software runs on computer 10. Another amplitude control unit is current feedback amplifier 23 and a digital potentiometer 24 in its feedback network that changes the gain and hence the channel signal amplitude. The amplitude control unit is also used to program the amplitude of RF sine signal in each channel per user amplitude choice through the user interface (details not shown). There are minor phase shifts due to low pass filter nature of the voltage divider. Also, changes in the gain of amplifier 23 slightly changes the 3 dB bandwidth of the amplifier and consequently changes the phase of RF signal in the channel. These errors are captured in error correction mechanism in core software algorithm. In this invention only the first method of voltage divider is used. Amplitude control unit can be placed anywhere in the channel signal path, but in this invention it is placed after phase shifter filters to keep the signal swings low in filters due to the current rating limitation of digital potentiometer.

Due to analog nature of this invention, there can be errors in phase and amplitude in each channel after programming which can come from numerous sources including but not limited to layout parasitics, electronic components variations, and so on. There is an error correction mechanism (not shown here) that observes electrical signals at each output of final power amplifiers $13_1$, $13_2$ ... $13_n$ at least once for any new load or frequency. Amplitude and phase errors are recorded in a deviation list. In this invention standard oscilloscope 10 communication is used to read the amplitude and phase errors, and results are sent to core software algorithm to create the deviation list. The deviation list values are added to the user desired phase and amplitudes to get correct operation of the beamformer. Also all digital potentiometers are read back after programming via microcontroller 9 to make sure programming was correct (details not shown).

After phase shifting and amplitude control in each channel, the electrical power is boosted by power amplifiers $13_1$, $13_2$ ... $13_n$ in differential or signal ended fashion as shown in FIG. 5. Differential power delivery is when final power amplifiers 25 and 26 receive the inverted and non-inverted sine signal, respectively, from the differential path before them (outputs of sign inverter shifter) and deliver power differentially to their load; this is what is implemented in this invention. It is also possible for both final power amplifiers 25 and 26 to receive same signal and one of them invert the signal for differential power delivery purposes.

Differential power delivery doubles the voltage swings to the load and hence make the electrical power 4 times more, where RF power is $V^2/(2*|Z|)$, with $|Z|$ is the magnitude of load impedance. $|Z|$ is a number near 50 ohm for standard piezoelectric loads in ultrasound applications, and V is the output peak voltage value at the load. In single ended fashion, amplifier 28 delivers the power to load 29 which is connected to circuit ground 30.

There are whole set of digital circuitry especially in the buffer circuit 8 (details not shown) that they control the analog beamformer, such as programming digital potentiometers and controlling RF switches. The digital commands to the beamformer hardware come from the micro-controller 9 which communicates with core software algorithm runs on computer 10.

This invention has been implemented on printed circuit boards (PCBs) using already designed electronic active and passive components. Same architecture can be implemented on chips for miniaturization to achieve most importantly higher channel counts, as in some medical applications up to 2000 channels are needed. High signal-to-noise ratio sine signals on PCBs at outputs of channels have been achieved with some circuit techniques, such as electromagnetic interference rejection techniques, circuit board layout techniques, and noise suppression techniques via low pass filtering.

Electrical power delivered to loads $13_1$, $13_2$ ... $13_n$ convert to mechanical power in ultrasound applications when loads are, for example, piezoelectric transducers. The mechanical acoustic power from each channel of the multi-channel system with different phase and amplitude (energy) per user choice will penetrate the object, where in case of medicine, is a human body. The penetrated waves will interfere with each other to form a focal point of energy where the acoustic energy is focused on that part of body. In case of HIFU, the focused energy will increase the temperature in small portion of the target tissue, and consequently cancer cells can be ablated non-invasively. This beamformer has many other applications in other medical fields, not only radiation oncology, as well as in non-medical fields. The invention can be used as an electromagnetic analog beamformer also.

What is claimed is:

1. A programmable analog beamformer device comprising:
    at least two independent user programmable logic controlling input radio frequency channels generating a single frequency sine signal driven by user selected phase and amplitude inputs;
    each channel having components serially connected from a buffer circuit to a phase-shifter, an amplitude control unit, a power amplifier and a load to a ground:
    each phase-shifter having a first order filter isolated by a buffer amplifier at input and output to maintain filters at first order;
    each load carrying half of the actual impendence in differential power delivery and complete impedance with a single ended power delivery, and
    each ground being a virtual ground wherein the differential power is zero voltage of a beamformer circuit and a real ground of the beamformer circuit where a single ended power delivers piezo electric loads for ultrasound transducer output
    whereby a user selected phase and amplitudes independently in an array of radio frequency parallel channels can focus ultrasound beams via transducer output onto a target.

2. A programmable analog beamformer device as in claim 1 further comprising phase shifting using filter delays to an RF signal from 0 degrees to 180/m degrees, phase shifting in each by programmable coupling a digital potentiometer resistor with a programmed capacitor forming a single pole filter for a phase delay.

3. A programmable analog beamformer device as in claim 1 further comprising additional phase shifting by conducting the RF sine signal in a channel through parallel inverting amplifier and non-inverting amplifiers and downstream serially to a RF switch with at least 3 dB bandwidth with respect to the frequency of operation.

4. A programmable analog beamformer device as in claim 1 further comprising phase shifting using filter amplitude attenuation compensation responsive to digital logic responsive to a channel filter capacitor, the channel signal frequency of operation and the channel filter resistance, amplitude compensation metered and provided by an amplitude control unit.

5. A programmable analog beamformer device as in claim 1 further comprising the amplitude control unit controlling the channel signal amplitude through a current feedback amplifier and a digital potentiometer in its feedback network that changes the gain and hence the channel signal amplitude.

6. A programmable analog beamformer device as in claim 1 further comprising the amplitude control unit operatively connected to user interface error correction logic responsive to changes in the gain of amplifier errors.

7. A programmable analog beamformer device as in claim 1 further comprising loads for piezoelectric transducers in ultrasound applications with standard impedance of 50 ohm at resonance frequencies, providing electric power to the loads single ended or differentially, wherein the loads are half of the actual impedance in differential power delivery, and complete impedance in case of single ended power delivery.

8. A programmable analog beamformer device as in claim 1 further comprising the first order filter having input from a buffer amplifier at input and buffer amplifier at output, acting as isolators to maintain a single pole of the filter with a decoupling capacitor between the input and output amplifiers, the filter having bias resistors, a programmable digital potentiometer resistor R and a capacitor C before the input to the output amplifier buffer for adjusting the filter R*C time constant.

9. A programmable analog beamformer device as in claim 1 further comprising control of the base shifting amount, with digital logic based on the component and frequency values resulting in a base shift of angle equal to arc tan (2*·pi·*f*C*R1)−arc tan(2*·pi·*f*C*R2), for resistor values programmed in the buffer logic for the filter output biasing resistors R1 and R2 where f is the frequency of operation in Hertz and C is a fixed capacitor in each filter in Farad, creating a filter non-linear and negative phase shift.

10. A method for programmable analog beamformer device further comprising the steps of:
  providing at least two independent user programmable logic controlling input radio frequency channels generating a single frequency sine signal driven by user selected phase and amplitude inputs;
  providing each channel with components serially connected from a buffer circuit to a phase-shifter, an amplitude control unit, a power amplifier and a load to a ground:
  isolating each phase-shifter with a first order filter with input and output buffer amplifiers to maintain filters at first order;
  carrying each load with half of the actual impendence in differential power delivery and complete impedance with a single ended power delivery, and
  providing virtual grounding for ground wherein the differential power is zero voltage of a beamformer circuit and a real ground of the beamformer circuit where a single ended power delivers piezo electric loads for ultrasound transducer output
  whereby a user selected phase and amplitudes independently in an array of radio frequency parallel channels can focus ultrasound beams via transducer output onto a target.

11. A method for programmable analog beamformer device as in claim 10 further comprising the steps of providing phase shifting using filter delays to an RF signal from 0 degrees to 180/m degrees, phase shifting in each by programmable coupling a digital potentiometer resistor with a programmed capacitor forming a single pole filter for a phase delay.

* * * * *

UNITED STATES PATENT AND TRADEMARK OFFICE
CERTIFICATE OF CORRECTION

PATENT NO. : 11,677,146 B2  
APPLICATION NO. : 16/230735  
DATED : June 13, 2023  
INVENTOR(S) : Gougol Page 1 of 1

It is certified that error appears in the above-identified patent and that said Letters Patent is hereby corrected as shown below:

On the Title Page

Item (22) the Related U.S. Application Data should read:
This application claims benefit to provisional application 62/609,880 filed on December 22, 2017.

Signed and Sealed this  
Thirtieth Day of July, 2024

Katherine Kelly Vidal  
*Director of the United States Patent and Trademark Office*